US012765322B2

(12) United States Patent
Sanemasa et al.

(10) Patent No.: US 12,765,322 B2
(45) Date of Patent: Oct. 13, 2026

(54) SUBSTRATE TRANSFER ROBOT SYSTEM AND TEACHING METHOD FOR SUBSTRATE TRANSFER ROBOT

(71) Applicant: KABUSHIKI KAISHA YASKAWA DENKI, Fukuoka (JP)

(72) Inventors: Hiroki Sanemasa, Fukuoka (JP); Koji Nagafuchi, Fukuoka (JP); Takashi Minami, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 319 days.

(21) Appl. No.: 18/510,341

(22) Filed: Nov. 15, 2023

(65) Prior Publication Data

US 2024/0178043 A1 May 30, 2024

(30) Foreign Application Priority Data

Nov. 30, 2022 (JP) ................................ 2022-190958

(51) Int. Cl.
*H10P 72/76* (2026.01)
*B25J 11/00* (2006.01)
(Continued)

(52) U.S. Cl.
CPC ....... *H10P 72/7602* (2026.01); *B25J 11/0095* (2013.01); *B25J 19/02* (2013.01); *H10P 72/50* (2026.01)

(58) Field of Classification Search
CPC ............... H01L 21/68707; H01L 21/68; H01L 21/67265; H01L 21/67766;
(Continued)

(56) References Cited

U.S. PATENT DOCUMENTS 5,563,798 A * 10/1996 Berken ................... H10P 72/53 414/935
5,783,834 A * 7/1998 Shatas ................. H10P 72/0606 414/941

(Continued)

FOREIGN PATENT DOCUMENTS

JP H06-072513 A 3/1994
JP 2019-214107 A 12/2019
JP 2020-098851 A 6/2020

OTHER PUBLICATIONS

An Office Action dated Apr. 28, 2026, issued from the Japan Patent Office (JPO) of Japanese Patent Application No. 2022-190958 (Japanese counterpart application) and EN Machine translation thereof. (6 pages).

*Primary Examiner* — Bhavesh V Amin
(74) *Attorney, Agent, or Firm* — Venjuris, P.C.

(57) ABSTRACT

A substrate transfer robot system teaches a transfer position of a substrate to a substrate transfer robot that transfers the substrate. The substrate transfer robot includes: a hand that transfers the substrate; a movement mechanism that moves the hand in horizontal and vertical directions; and first and second sensors that are provided on the hand and radiates a scanning line in the horizontal and vertical directions, respectively. The substrate transfer robot system includes: a controller that controls the hand and the movement mechanism; and a first portion to be detected and a second portion to be detected. The controller operates the hand to detect the first portion by the first and second sensors and detect the second portion by the second sensor, and calculates and stores the transfer position based on position information of the hand when the first and second portions are detected.

17 Claims, 15 Drawing Sheets

(51) Int. Cl.
*B25J 19/02* (2006.01)
*H10P 72/50* (2026.01)

(58) Field of Classification Search
CPC ............. H01L 21/67778; H01L 21/681; H01L 21/67259; H01L 21/67781; H01L 22/12; H01L 22/20; H01L 21/67742; B25J 11/0095; B25J 19/02; B25J 13/08; B25J 9/04; B25J 9/1664; B25J 15/0014
See application file for complete search history.

(56) References Cited

U.S. PATENT DOCUMENTS

| | | | | | |
|---|---|---|---|---|---|
| 5,981,966 | A * | 11/1999 | Honma | H10P 72/0606 | 414/172 |
| 6,040,585 | A * | 3/2000 | Hsiao | H10P 72/53 | 414/217 |
| 6,075,334 | A * | 6/2000 | Sagues | H10P 72/53 | 414/416.03 |
| 6,304,051 | B1 * | 10/2001 | Sagues | H10P 72/0606 | 318/568.15 |
| 6,323,616 | B1 * | 11/2001 | Sagues | H10P 72/0608 | 318/568.15 |
| 6,502,054 | B1 * | 12/2002 | Mooring | G05B 19/4083 | 702/149 |
| 6,629,053 | B1 * | 9/2003 | Mooring | G05B 19/401 | 702/94 |
| 6,633,046 | B1 * | 10/2003 | Mitchell | B25F 5/001 | 356/399 |
| 6,822,413 | B2 * | 11/2004 | Simondet | H10P 72/3402 | 318/567 |
| 6,842,220 | B1 * | 1/2005 | Dishon | G03F 7/70058 | 356/400 |
| 6,856,863 | B1 * | 2/2005 | Sundar | H10P 72/0606 | 700/218 |
| 6,934,606 | B1 * | 8/2005 | Genetti | H10P 72/3408 | 118/712 |
| 6,996,456 | B2 * | 2/2006 | Cordell | G05B 19/425 | 700/262 |
| 7,054,713 | B2 * | 5/2006 | Teng | H10P 72/0608 | 700/218 |
| 7,109,510 | B2 * | 9/2006 | Radahl | G03F 9/7003 | 250/559.3 |
| 7,217,076 | B2 * | 5/2007 | Bonora | H10P 72/3408 | 414/217.1 |
| 7,235,806 | B2 * | 6/2007 | Beginski | H10P 72/0606 | 250/221 |
| 7,397,539 | B2 * | 7/2008 | Willems Van Dijk | G03F 7/70741 | 355/75 |
| 7,551,979 | B2 * | 6/2009 | Saraliev | B25J 9/1692 | 414/754 |
| 7,706,919 | B2 * | 4/2010 | Adachi | H10P 72/0606 | 700/250 |
| 8,041,450 | B2 * | 10/2011 | Takizawa | H10P 72/0608 | 700/214 |
| 8,078,304 | B2 * | 12/2011 | Rice | G05B 19/41875 | 414/935 |
| 8,215,890 | B2 * | 7/2012 | Tseng | H10P 72/53 | 414/940 |
| 8,688,261 | B2 * | 4/2014 | Hirota | B25J 9/1692 | 700/214 |
| 8,688,276 | B2 * | 4/2014 | Fujii | H10P 72/53 | 700/258 |
| 9,099,508 | B2 * | 8/2015 | Hertgens | H10P 72/0606 | |
| 9,114,534 | B2 * | 8/2015 | Trompeter | B25J 9/1692 | |
| 9,153,469 | B2 * | 10/2015 | Kobayashi | H10P 72/50 | |
| 9,238,303 | B2 * | 1/2016 | Yoshida | B25J 9/163 | |
| 9,972,519 | B2 * | 5/2018 | Yuk | H10P 72/53 | |
| 10,811,294 | B2 * | 10/2020 | Jung | H10P 72/0606 | |
| 11,551,953 | B2 * | 1/2023 | Yoshida | H10P 72/0606 | |
| 11,673,275 | B2 * | 6/2023 | Rogers | B25J 9/042 | 901/30 |
| 11,858,147 | B2 * | 1/2024 | Okada | B25J 9/1692 | |
| 2002/0130250 | A1 * | 9/2002 | Chung | H10P 72/0608 | 250/221 |
| 2003/0060922 | A1 * | 3/2003 | Schauer | H10P 72/14 | 700/213 |
| 2003/0110649 | A1 * | 6/2003 | Hudgens | H10P 72/0606 | 33/286 |
| 2003/0198376 | A1 * | 10/2003 | Sadighi | H10P 72/0606 | 382/153 |
| 2004/0067127 | A1 * | 4/2004 | Hofmeister | B25J 19/02 | 414/744.5 |
| 2004/0197179 | A1 * | 10/2004 | Achkire | H10P 72/7602 | 414/618 |
| 2004/0228235 | A1 * | 11/2004 | Togashi | G11B 7/094 | 369/44.37 |
| 2005/0030524 | A1 * | 2/2005 | Perry | G01C 1/00 | 356/140 |
| 2005/0036863 | A1 * | 2/2005 | Wakizako | H10P 72/0608 | 414/936 |
| 2005/0102064 | A1 * | 5/2005 | Donoso | H10P 72/0606 | 700/254 |
| 2005/0201424 | A1 * | 9/2005 | Yoshida | H10P 72/53 | 372/9 |
| 2006/0021639 | A1 * | 2/2006 | Masuda | H10P 72/0416 | 134/61 |
| 2007/0065144 | A1 * | 3/2007 | Hofmeister | H10P 72/53 | 355/72 |
| 2007/0081881 | A1 * | 4/2007 | Okuno | H10P 72/3402 | 414/217 |
| 2007/0273892 | A1 * | 11/2007 | Asari | H10P 72/7602 | 356/614 |
| 2008/0175693 | A1 * | 7/2008 | Fujii | H10P 72/0461 | 414/217 |
| 2009/0024241 | A1 * | 1/2009 | Rice | G05B 19/41875 | 901/50 |
| 2010/0119349 | A1 * | 5/2010 | Hofmeister | B25J 19/02 | 414/800 |
| 2010/0282956 | A1 * | 11/2010 | Kimba | H01J 37/28 | 250/252.1 |
| 2012/0118083 | A1 * | 5/2012 | Mori | H10P 72/53 | 73/864.91 |
| 2014/0277715 | A1 * | 9/2014 | Nagai | B25J 9/1692 | 700/254 |
| 2016/0133502 | A1 * | 5/2016 | Won | H10P 72/7602 | 901/46 |
| 2017/0018446 | A1 * | 1/2017 | Yin | H10P 72/50 | |
| 2018/0029237 | A1 * | 2/2018 | Sugawara | B25J 9/1697 | |
| 2019/0237354 | A1 * | 8/2019 | Liu | H10P 72/3302 | |
| 2020/0144097 | A1 * | 5/2020 | Thaulad | H10P 72/53 | |
| 2020/0324410 | A1 * | 10/2020 | Bergantz | B25J 9/1664 | |
| 2021/0291375 | A1 * | 9/2021 | Bergantz | B25J 9/1692 | |
| 2021/0300690 | A1 * | 9/2021 | Otogawa | B65G 47/90 | |
| 2021/0387301 | A1 * | 12/2021 | O'Hare | G01B 5/008 | |
| 2022/0108911 | A1 * | 4/2022 | Murata | H10P 72/0606 | |
| 2022/0193917 | A1 * | 6/2022 | Tan | B25J 11/0095 | |
| 2022/0277981 | A1 * | 9/2022 | Amikura | H01J 37/32642 | |
| 2023/0064941 | A1 * | 3/2023 | Lee | H10P 72/53 | |
| 2023/0119986 | A1 * | 4/2023 | Osaka | B65G 47/90 | 414/751.1 |
| 2023/0163009 | A1 * | 5/2023 | Kim | H10P 72/3302 | 414/751.1 |
| 2023/0420286 | A1 * | 12/2023 | Kiyokawa | H10P 72/7602 | |
| 2024/0109200 | A1 * | 4/2024 | Nagafuchi | B25J 9/042 | |
| 2024/0139967 | A1 * | 5/2024 | Lee | B25J 9/1682 | |
| 2024/0178043 | A1 * | 5/2024 | Sanemasa | H10P 72/0606 | |
| 2024/0178044 | A1 * | 5/2024 | Tokairin | H10P 72/7602 | |
| 2024/0186175 | A1 * | 6/2024 | Minami | H10P 72/53 | |
| 2024/0253233 | A1 * | 8/2024 | Hashizaki | B25J 9/1664 | |
| 2024/0278433 | A1 * | 8/2024 | Nagafuchi | B25J 9/1692 | |
| 2024/0424666 | A1 * | 12/2024 | Kinoshita | B25J 9/0081 | |
| 2025/0022736 | A1 * | 1/2025 | Momoki | B25J 9/107 | |
| 2025/0026013 | A1 * | 1/2025 | Imanishi | B25J 9/1651 | |
| 2025/0079216 | A1 * | 3/2025 | Kondoh | H10P 72/3206 | |

* cited by examiner

SUBSTRATE TRANSFER ROBOT SYSTEM AND TEACHING METHOD FOR SUBSTRATE TRANSFER ROBOT

CROSS-REFERENCE TO RELATED APPLICATIONS

This application is based on and claims priority from Japanese Patent Application No. 2022-190958 filed on Nov. 30, 2022 with the Japan Patent Office, the disclosure of which is incorporated herein in its entirety by reference.

TECHNICAL FIELD

The present disclosure relates to a substrate transfer robot system and a teaching method for a substrate transfer robot.

BACKGROUND

In the related art, a transfer system has been known, which uses a robot with a hand to transfer substrates such as wafers and panels to and from a cassette that holds the substrates.

In such a transfer system, it is necessary to perform a teaching work in advance to teach the robot the position of entry of the hand into the cassette. Regarding the teaching work, for example, a technique has been proposed in which the teaching work is performed using a dummy cassette formed in the same shape as the cassette used in actual operation (see, e.g., Japanese Patent Laid-Open Publication No. 2019-214107).

SUMMARY

The above-mentioned technology of the related art has room for further improvement in terms of increasing the efficiency and precision of the teaching work in loading and unloading of substrates.

For example, when the above-mentioned technique of the related art is used, it is necessary to prepare a dummy cassette for teaching work separately from the cassette, which is inefficient. Further, when there is an error between the shape of the cassette and the shape of the dummy cassette, the accuracy of the teaching work may not be ensured. Furthermore, it is necessary for an operator to sequentially move the robot to a predetermined teaching position relative to the dummy cassette while visually checking the robot, which leaves room for human error.

One aspect of an embodiment provides a substrate transfer robot system and a teaching method for the substrate transfer robot, which may improve the efficiency and precision of the teaching work in loading and unloading substrates.

According to one aspect of the embodiment, a substrate transfer robot system teaches a transfer position of a substrate to a substrate transfer robot that transfers the substrate. The substrate transfer robot includes: a hand that transfers the substrate: a movement mechanism that moves the hand in a horizontal direction and in a vertical direction: and first and second sensors that are provided on the hand and radiates a scanning line in the horizontal direction and in the vertical direction, respectively. The substrate transfer robot system includes: a controller that controls the hand and the movement mechanism; and first and second detected portion of which positions from the transfer position and positions from each other are known, the first and second portion being provided at the transfer position. The controller operates the hand to detect the first detected portion by the first and second sensors and detect the second detected portion by the second sensor, and calculates and stores the transfer position from position information of the hand when the first and second detected portions are detected.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, a substrate transfer robot system and a teaching method for a substrate transfer robot of the present disclosure will be described in detail with reference to the drawings. The present disclosure is not limited to the embodiments described herein below.

Further, in the embodiments described herein below, expressions such as "parallel," "front," "parallel," and "intermediate" may be used, but these conditions may not be strictly satisfied. That is, the expressions may allow deviations in, for example, manufacturing accuracy, installation accuracy, processing accuracy, and detection accuracy.

(Configuration Example of Robot System 1)

Figure 1:
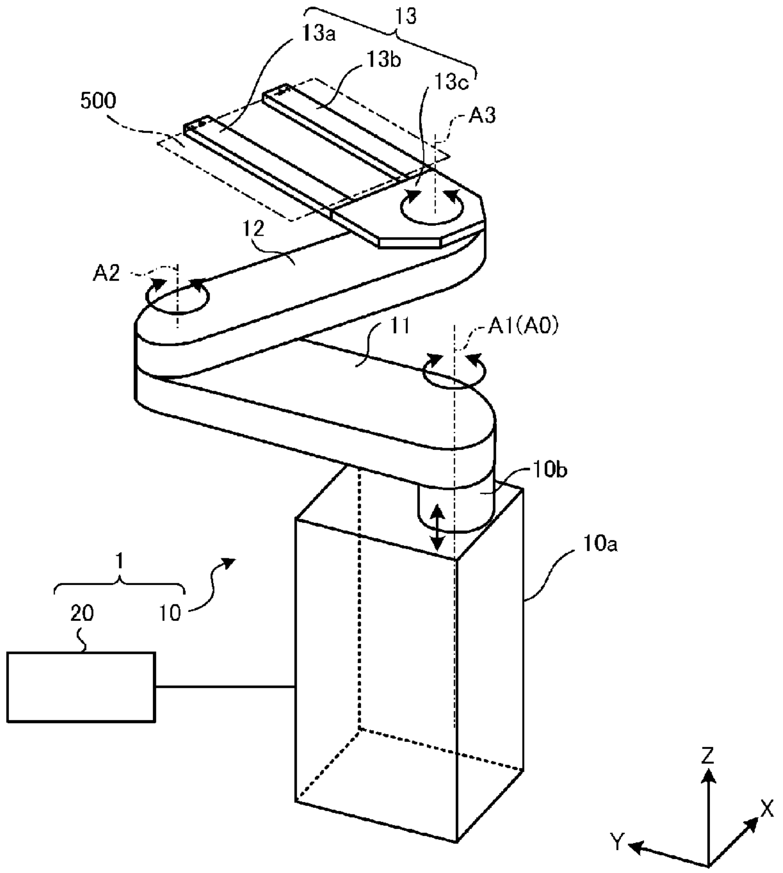
FIG. 1 is a schematic view illustrating a configuration example of a robot system.
Figure 2:
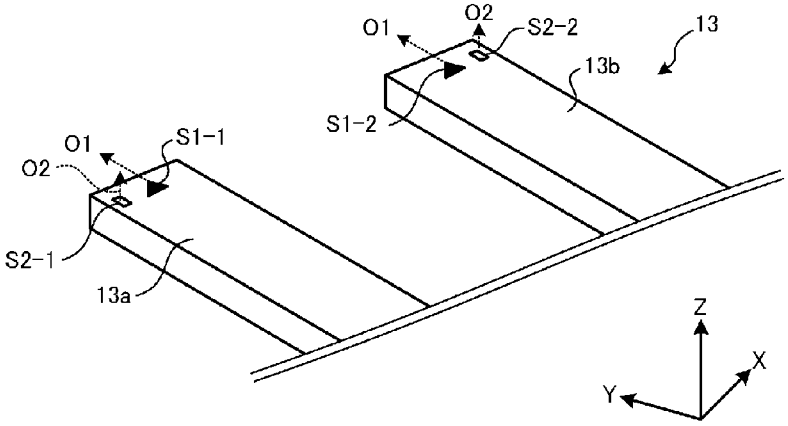
FIG. 2 is a view illustrating an arrangement example of the first sensor and the second sensor.

First, a configuration example of a robot system 1 according to an embodiment will be described with reference to FIG. 1. FIG. 1 is a schematic view illustrating a configuration example of the robot system 1. FIG. 2 is a view illustrating an arrangement example of a first sensor S1 and a second sensor S2.

The robot system 1 is a substrate transfer robot system that teaches a transfer position of a substrate 500 to a robot 10 that transfers the substrate 500. In the embodiment, it is assumed that the substrate 500 is a rectangular panel made of a resin material such as glass epoxy, or a glass substrate. In addition, in the embodiment, the transfer position of the substrate 500 is assumed to be the ideal storage position (hereinafter referred to as a "regular position" as appropriate) in each stage (each slot) of a cassette 200 (see, e.g., FIG. 3 and subsequent figures) that accommodates substrates 500 in multiple stages.

As illustrated in FIG. 1, the robot system 1 includes a robot 10 and a controller 20. The robot 10 is a substrate transfer robot that transfers the substrate 500. The robot 10 includes a hand 13 that transfers the substrate 500, and a movement mechanism that moves the hand 13 horizontally and vertically.

To facilitate the understanding of the descriptions, FIG. 1 illustrates a three-dimensional orthogonal coordinate system with a Z axis having the vertical upward direction as a positive direction, an X axis parallel to a left-right direction along the front side of a cassette 200, and an Y axis parallel to a depth direction of the cassette 200. The "horizontal direction" as described above refers to a direction along the XY plane of the orthogonal coordinate system. Moreover, the "vertical direction" refers to a direction along the Z-axis direction of the orthogonal coordinate system. The orthogonal coordinate system may also be illustrated in other drawings used in the following descriptions.

Further, the front side of the cassette 200 refers to a lateral side of the cassette 200 that has an opening into which the hand 13 is capable of being inserted. Further, the depth direction of the cassette 200 refers to a direction in which the hand 13 is advanced into or retreated from the front side of the cassette 200 in order to load and unload the substrate 500. A configuration example of the cassette 200 will be described later with reference to FIGS. 4 and 5.

(Configuration Example of Robot 10)

A configuration example of the robot 10 will be described in more detail. The robot 10 is, for example, a horizontally articulated robot having a horizontally articulated SCARA arm and a lift mechanism. As illustrated in FIG. 1, The robot 10 includes a body portion 10*a*, a lift portion 10*b*, a first arm 11, a second arm 12, and a hand 13. The body portion 10*a* is fixed to, for example, a bottom surface of the transfer chamber for the substrate 500, and incorporates a lift mechanism for moving up and down the lift portion 10*b*.

The lift portion 10*b* moves up and down along a lift axis A0 and supports the proximal end side of the first arm 11 so as to be rotatable around a first axis A1. The lift portion 10*b* itself may be rotated around the first axis A1. Alternatively, the first axis A1 may be positioned closer to the negative direction of the Y-axis direction on the upper surface of the lift portion 10*b*. The first arm 11 may be made longer by positioning the first axis A1 closer to the negative direction of the Y-axis direction.

The first arm 11 supports the proximal end side of the second arm 12 on the distal end side so as to be rotatable around a second axis A2. The second arm 12 supports the proximal end side of the hand 13 on the distal end side so as to be rotatable around a third axis A3.

Thus, the robot 10 is a horizontally articulated robot including three links of the first arm 11, the second arm 12, and the hand 13. Thus, the robot 10 may freely transfer the substrate 500 in the horizontal direction.

Further, as described above, the robot 10 includes the lift portion 10*b* and the body portion 10*a* that move up and down the lift portion 10*b*. Thus, it is possible to access each substrate 500 accommodated in multiple stages in the cassette 200, and to acquire the presence or absence of each accommodated substrate 500 by moving the hand 13. The body portion 10*a*, the lift portion 10*b*, the first arm 11, and the second arm 12 correspond to an example of an "movement mechanism" that moves the hand 13 in the horizontal direction and the vertical direction.

The hand 13 includes a first fork portion 13*a*, a second fork portion 13*b*, and a base portion 13*c*. The first fork portion 13*a* and the second fork portion 13*b* are branched from the base portion 13*c* and extend to face each other with a gap therebetween.

The first fork portion 13*a* and the second fork portion 13*b* support the substrate 500 from below when the substrate 500 is transferred. The first fork portion 13*a* and the second fork portion 13*b* have a holding mechanism (not illustrated) that employs, for example, a contact adsorption method, a non-contact adsorption method, or a grasping method, and hold and support the substrate 500 by the holding mechanism.

Further, as illustrated in FIG. 2, a first sensor S1 and a second sensor S2 are provided on the distal end sides of the upper surfaces of the first fork portion 13*a* and the second fork portion 13*b*, respectively.

The first sensor S1 is a sensor that detects an object such as the cassette 200 or the substrate 500 inside the cassette 200. The second sensor S2 is a sensor that detects the presence or absence of the substrate 500 on the hand 13 (so-called load presence sensor).

The first sensor S1 and the second sensor S2 are, for example, reflective laser sensors. The first sensor S1 emits a scanning line O1 in the horizontal direction along the XY plane. The second sensor S2 emits a scanning line O2 in the vertical direction along the Z-axis direction. The first and second sensors S1 and S2 detect the presence or absence and position of the object by detecting the reflected light of the scanning lines O1 and O2 reflected and returning from the cassette 200, the substrate 500 in the cassette 200, and the substrate 500 supported by the hand 13.

FIG. 2 illustrates an example in which a set of the first sensor S1 and the second sensor S2 is provided at the distal end sides of the first fork portion 13*a* and the second fork portion 13*b* that are branched into two portions from the base portion 13*c*. However, this set may be provided in at least one of the first fork portion 13*a* and the second fork portion 13*b*. Meanwhile, when the hand 13 branches into three or more portions, a set of the first sensor S1 and the second sensor S2 may be provided at the distal end side of each branched fork portion. That is, the hand 13 may be provided with the same number of sets of the first sensors S1 and the second sensors S2 as the number of fork portions.

The descriptions will refer back to FIG. 1. The controller 20 controls the hand 13 and the movement mechanism described above. At this time, the controller 20 controls the hand 13 and the movement mechanism based on each position in the XYZ direction of the transfer position of the substrate 500 stored in advance, i.e., the position of each transfer position in the left-right direction (the position in X axis direction), the position in the depth direction (the position in Y axis direction), and the height position (the position in Z axis direction).

(Overview of Teaching Method for Robot 10)

Figure 3:
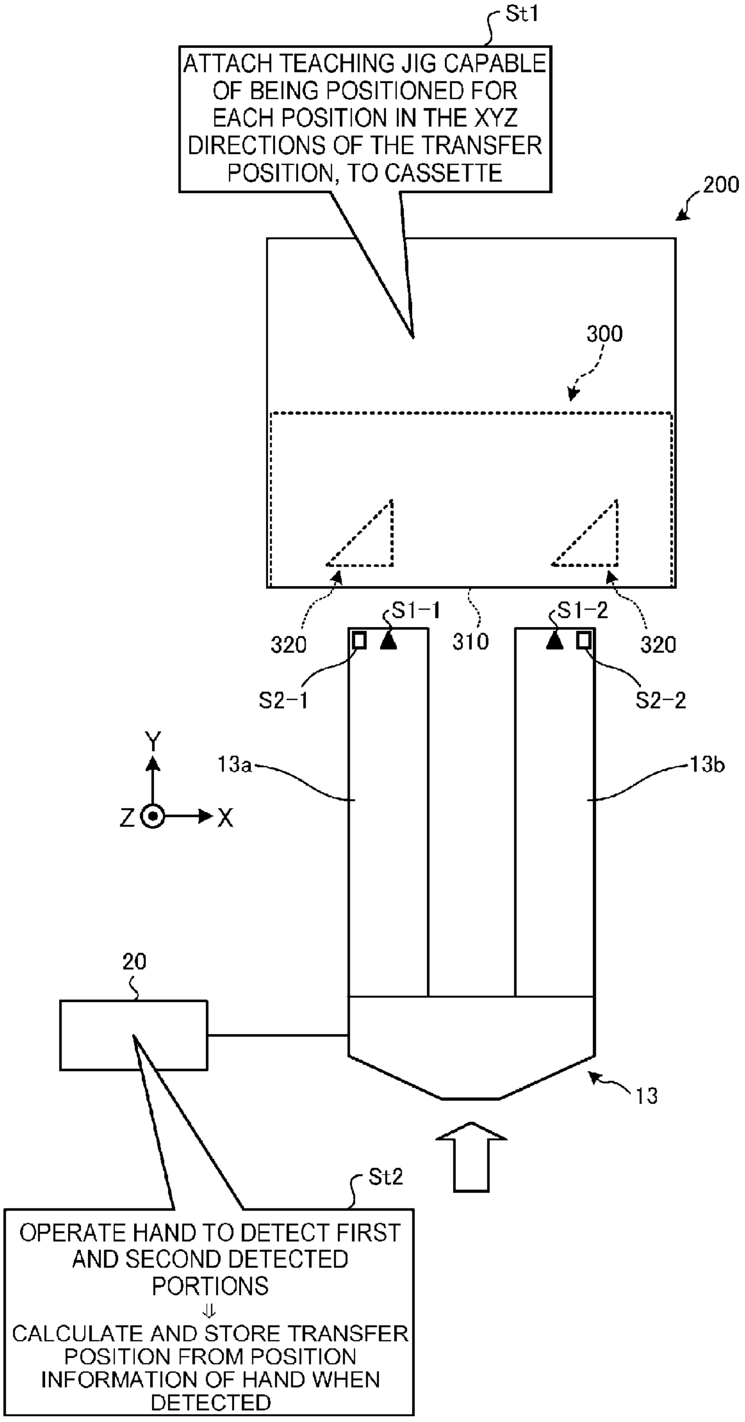
FIG. 3 is a view illustrating an overview of a teaching method for a robot.

Next, an overview of the teaching method for the robot 10 executed by the robot system 1 will be described with reference to FIG. 3. FIG. 3 is a view illustrating an overview of a teaching method for the robot 10.

In the teaching method for the robot 10 according to the embodiment, a teaching jig 300 is used when the controller 20 stores in advance the horizontal position, the depth position, and the height position of each of the transfer positions as described above.

The teaching jig 300 may be installed at each transfer position of the cassette 200 in a manner analogous to the substrate 500, and is configured to enable positioning that defines the substrate 500 in its regular position for each position in the XYZ directions of each transfer position in the cassette 200.

As illustrated in FIG. 3, in the teaching method for the robot 10 according to the embodiment, first, a teaching jig 300 capable of being positioned for each position in the XYZ directions of the transfer position is attached to the cassette 200 (step St1).

The teaching jig 300 includes a first detected portion 310 and a second detected portion 320 of which positions from the transfer position and positions from each other are known. The first detected portion 310 and the second detected portion 320 are provided at positions close to the front side of the cassette 200 when the teaching jig 300 is attached to the cassette 200. The first sensor S1 and the second sensor S2 provided on the distal end side of the hand 13 detect the first detected portion 310 and the second detected portion 320 before the hand 13 reaches the deep portion of the cassette 200.

The first detected portion 310 is, for example, a front end portion of the teaching jig 300 that is exposed on the front side of the cassette 200 when the teaching jig 300 is attached to the cassette 200. Further, the second detected portion 320 is, for example, a right-angled isosceles triangle-shaped hole formed to have at least a first detection line 321 and a second detection line 322 (both see, e.g., FIG. 9 and subsequent figures) that are at least non-parallel to each other and have a known positional relationship, which may be continuously detected by the second sensor S2 while the hand 13 is being operated by the movement mechanism.

At least one second detected portion 320 is formed to be detectable by at least one of second sensors S2-1 and S2-2 when the hand 13 is advanced into the cassette 200. In this embodiment, as illustrated in FIG. 3, two second detected portions 320 are formed, which are detectable by the second sensors S2-1 and S2-2, respectively, when the hand 13 advanced into the cassette 200.

Further, when the hand 13 approaches the transfer position from below, the first detection line 321 and the second detection line 322 in the second detected portion 320 are detected by the second sensor S2 from below the transfer position. A specific example of the configuration of the first detection line 321 and the second detection line 322 will be described later with reference to FIG. 9.

In the teaching method for the robot 10 according to the embodiment, the controller 20 operates the hand 13 to detect the first detected portion 310 and the second detected portion 320, and calculates and stores the transfer position from position information of the hand 13 when detected (step St2).

As described above, in the teaching method for the robot 10 according to the embodiment, the teaching jig 300 includes the first detected portion 310 and the second detected portion 320 of which positions from the transfer position and positions from each other are known. Then, the controller 20 operates the hand 13 to detect the first detected portion 310 and the second detected portion 320, and calculates and stores the transfer position from position information of the hand 13 when detected.

Therefore, according to the teaching method for the robot 10 according to the embodiment, it is possible to automate the teaching work in which human error is less likely to occur. Accordingly, it is possible to improve the efficiency and precision of the teaching work when loading and unloading the board 500.

More specific examples of the configuration of the teaching jig 300 that is capable of positioning each position in the XYZ directions of the transfer position will be described later with reference to FIGS. 6 to 9.

(Configuration Example of Cassette 200)

Figure 4:
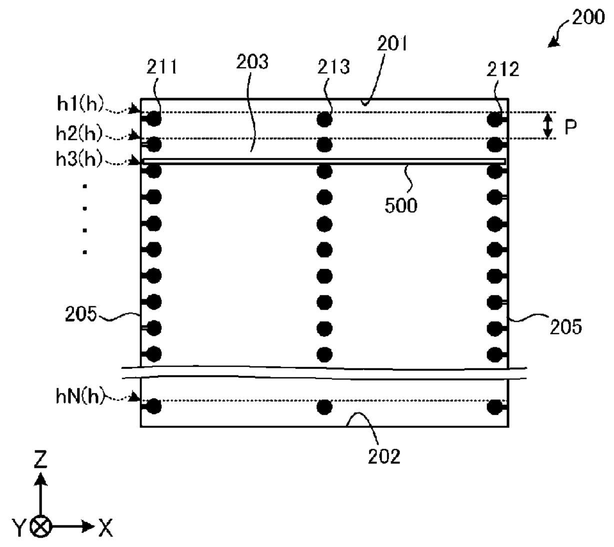
FIG. 4 is a schematic front view illustrating a cassette.
Figure 5:
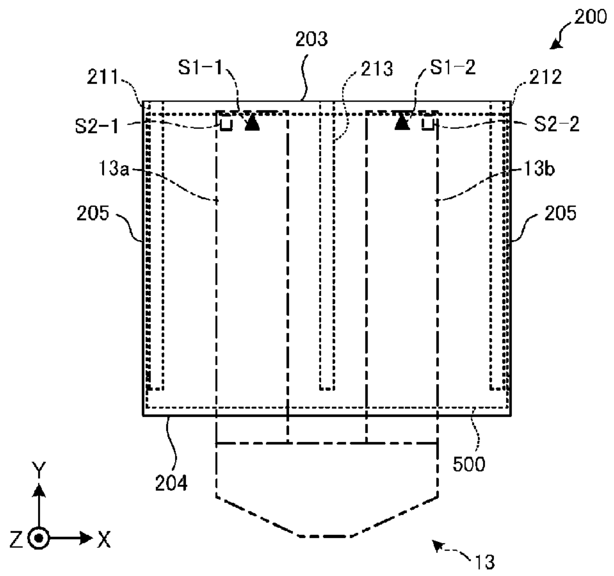
FIG. 5 is a schematic top view illustrating the cassette.

Next, the cassette 200 illustrated in FIG. 3 will be described with reference to FIGS. 4 and 5. FIG. 4 is a schematic front view of the cassette 200. Further, FIG. 5 is a schematic top view of the cassette 200. In FIG. 5, the hand 13 at a delivery position of the substrate 500 in the cassette 200 is indicated by a two-dot chain line.

The cassette 200 is a general-purpose cassette that accommodates the substrates 500 in multiple stages. As illustrated in FIG. 3A, the front side of the cassette 200 is open, and N-stage slots (N is a natural number greater than or equal to 2) are provided between top surface 201 and a bottom surface 202 inside the cassette 200, each of which may accommodate a substrate 500. Each slot is provided with a first support portion 211, a second support portion 212, and a third support portion 213 extending in a direction along the depth direction (Y-axis direction) of the cassette 200. The first support portion 211, the second support portion 212, and the third support portion 213 support the substrate 500 placed by the hand 13 from below.

Each slot supports the substrate 500 at a placement height h. When distinguishing the placement height of each stage, the height of the first stage is expressed as a placement height h1, the height of the second stage is expressed as a placement height h2, and the height of the N-th stage is expressed as a placement height hN. In addition, it is assumed that a pitch P between slots is equal.

The first support portion 211 and the second support portion 212 are provided on the lateral side 205 inside the cassette 200. Further, the third support portion 213 is provided at an intermediate position between the first support portion 211 and the second support portion 212 in the left-right direction (X-axis direction) of the cassette 200. That is, the cassette 200 supports the substrate 500 at three points when viewed from the front side. Although FIG. 4 illustrates a case where there is one third support portion 213, for example, two or more third support portions 213 may be provided.

Here, as illustrated in FIG. 5, the hand 13 is provided such that the first fork portion 13*a* is advanced between the first support portion 211 and the third support portion 213 of the cassette 200, and the second fork portion 13*b* is advanced between the second portion 212 and the second support portion 212. As described above, when two or more third support portions 213 are provided, the hand 13 may be provided with a number of fork portions that may be inserted between the respective support portions. Meanwhile, the number of support portions and the number of fork portions do not necessarily have to be linked. For example, in the example of FIG. 5, the hand 13 may also be provided with two or more fork portions which may be inserted between the first support portion 211 and the third support portion 213 or between the second support portion 212 and the third support portion 213.

As described above, the cassette 200 includes the first support portion 211 and the second support portion 212 that support both ends of the substrate 500, respectively, when viewed from the front side 204 of the cassette 200. Further, the cassette 200 includes the third support portion 213 that supports the substrate 500 at an intermediate position between the first support portion 211 and the second support portion 212.

Further, the hand 13 includes at least the first fork portion 13*a* that may be advanced between the first support portion 211 and the third support portion 213, and the second fork portion 13*b* that may be advanced between the second support portion 212 and the third support portion 213. The first sensor S1 and the second sensor S2 are provided on the distal end sides of the first pork portion 13*a* and the second pork portion 13*b* of the hand 13, respectively.

(Configuration Example of Teaching Jig 300)

Figure 6:
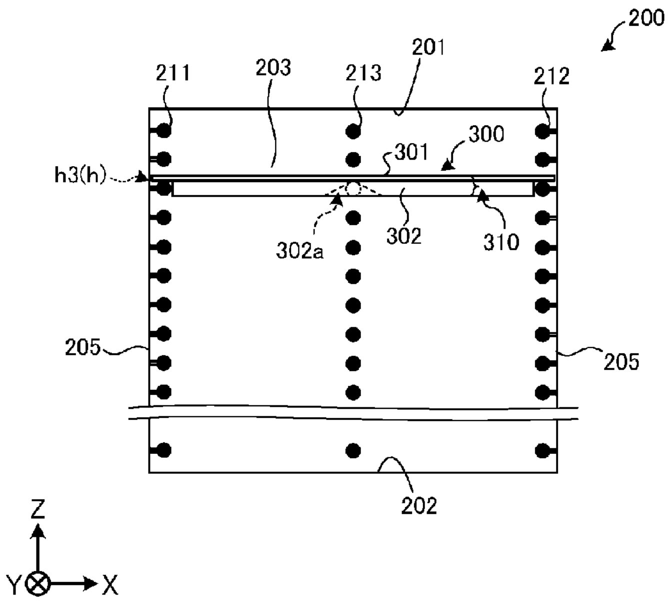
FIG. 6 is a schematic front view illustrating the cassette with the teaching jig attached.
Figure 7:
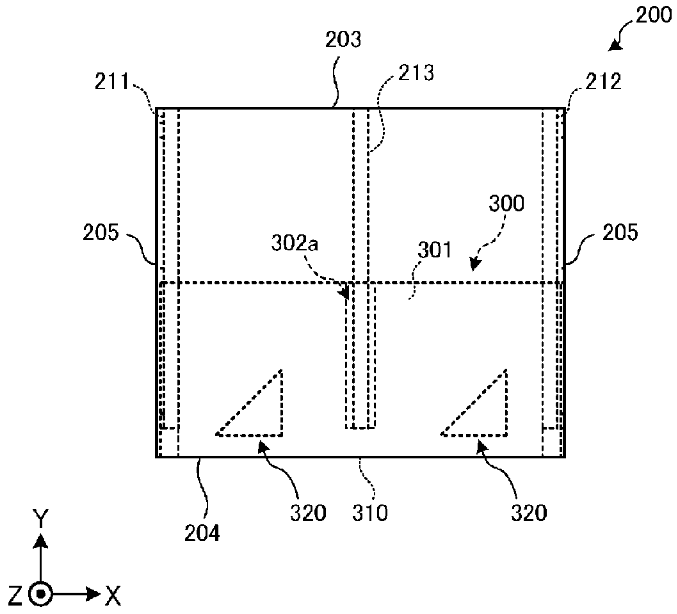
FIG. 7 is a schematic top view illustrating the cassette with the teaching jig attached.
Figure 8:
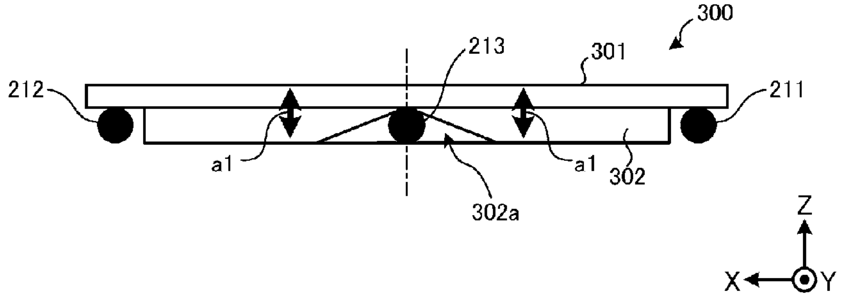
FIG. 8 is a schematic rear view illustrating the teaching jig.
Figure 9:
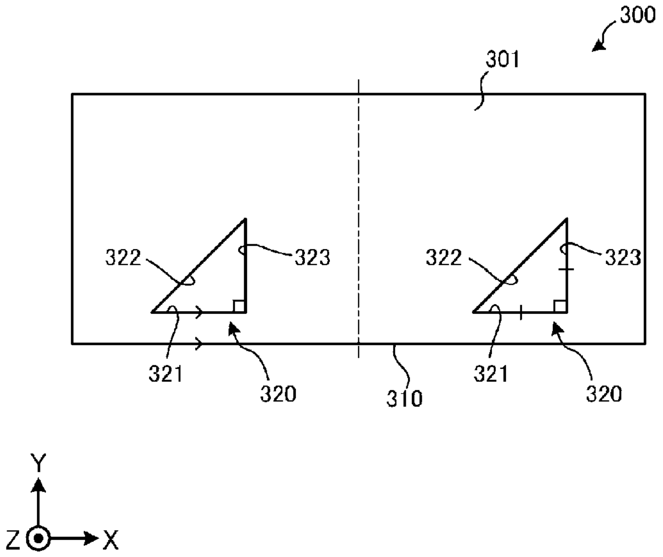
FIG. 9 is a schematic top view illustrating the teaching jig.

Next, a configuration example of the teaching jig 300 will be described with reference to FIGS. 6 to 9. FIG. 6 is a schematic front view illustrating the cassette 200 with the teaching jig 300 attached. Further, FIG. 7 is a schematic top view illustrating the cassette 200 with the teaching jig 300 attached. Further, FIG. 8 is a schematic rear view illustrating the teaching jig 300. Further, FIG. 9 is a schematic top view of the cassette 300.

Although FIG. 6 illustrates an example in which the teaching jig 300 is mounted at the transfer position at a placement height h3, this is for convenience of explanation, and any placement height h is acceptable.

As illustrated in FIG. 6, the teaching jig 300 includes a base portion 301 and a contact portion 302. The base portion 301 is a base portion of the teaching jig 300 which is formed into a thin plate shape, and corresponds to a part of the substrate 500. As illustrated in FIG. 7, the base portion 301 has a width dimension equivalent to that of the substrate 500 in the left-right direction (X-axis direction), and a length dimension, for example, about half that of the substrate 500 in the depth direction (Y-axis direction). The length in the depth direction (Y-axis direction) may be any length as long as the teaching jig 300 can be accommodated in the cassette 200. A shorter length has an advantage that the teaching jig 300 may be made lighter and easier to handle.

The teaching jig 300 is positioned in the vertical direction (Z-axis direction) by having the base 301, which has the same width dimension as the substrate 500, supported by the first support portion 211 and second support portion 212 at both ends in the horizontal direction (X-axis direction).

The contact portion 302 is a portion of the teaching jig 300 that comes into contact with at least two of the first support portion 211, the second support portion 212, and the third support portion 213. The teaching jig 300 is positioned in the horizontal direction and the vertical direction by the contact portion 302, and is provided to be detachably attached to the first support portion 211, the second support portion 212, and the third support portion 213.

Further, the contact portion 302 is provided to be at least partially movable with respect to the base portion 301 of the teaching jig 300 so that the position of the teaching jig 300 may be adjusted with respect to the cassette 200.

For example, the contact portion 302 has a recess 302*a* that determines the position of the teaching jig 300 at least with respect to the front side 204 of the cassette 200 in the left-right direction (X-axis direction) by fitting the third support portion 213 thereto, as illustrated in FIGS. 6 and 7.

The recess 302*a* is a groove formed such that the third support portion 213 is fitted therein. As illustrated in FIG. 7, the recess 302*a* is formed with a length dimension in which the teaching jig 300 is positioned in the depth direction (Y-axis direction), for example, by pressing the distal end of the third support portion 213 against the recess 302*a*.

Further, as illustrated in FIG. 8, the recess 302*a* is formed in a triangular shape that contacts the third support portion 213 at the apex portion in a cross-sectional view taken along the XZ plane. This cross-sectional shape may not be limited to a triangular shape. Further, the recess 302*a* is movable with respect to the base portion 301, as illustrated by the arrow a1, so that the depth of the depression of the recess 302*a* may be changed.

The description will refer back to FIGS. 6 and 7. Further, the teaching jig 300 includes the first detected portion 310 described above. The first detected portion 310 is a front end portion of the teaching jig 300, which includes an end surface of the base portion 301 and an end surface of the contact portion 302 exposed from the front side of the cassette 200.

Further, the teaching jig 300 includes the second detected portion 320 described above. The second detected portion 320 is provided at least one between the first support portion 211 and the third support portion 213 and between the second support portion 212 and the third support portion 213, and close to the front 204 side of the cassette 200 when the teaching jig 300 is attached to the cassette 200.

Further, the second detected portion 320 is formed as a through hole that penetrates from the base portion 301 to the contact portion 302. Here, as illustrated in FIG. 9, the second detected portion 320 is formed in a shape of a right-angled isosceles triangle including a first detection line 321, a second detection line 322, and a third line 323.

The first detection line 321 is formed parallel to the edge of the first detected portion 310. The third line 323 is formed perpendicular to and equilateral to the first detection line 321. The second detection line 322 is formed to be an oblique side connecting the first detection line 321 and the third line 323. Therefore, the first detection line 321 and the second detection line 322 are at least non-parallel to each other.

Further, the first detection line 321 and the second detection line 322 are formed to be continuously detected by the second sensor S2 while the hand 13 is being operated by the movement mechanism.

The shape and size of the second detected portion 320, the position of the second detected portion 320, the positional relationship between the first detection line 321 and the second detection line 322, and the positional relationship with the first detected portion 310 are stored in advance by the controller 20 as information regarding the teaching jig 300. Therefore, the first detection line 321 and the second detection line 322 have at least a known positional relationship with each other.

In the present embodiment, the second detected portion 320 is a right-angled isosceles triangular through hole, but the second detected portion 320 may be a member of any shape that allows at least the first detection line 321 and the second detection line 322 to be detected by the second sensor S2. Therefore, the second detected portion 320 may be provided, for example, as a slit that represents only the first detection line 321 and the second detection line 322. Further, the second detected portion 320 may be provided, for example, as a right-angled isosceles triangular protrusion, instead of a right-angled isosceles triangular through hole.

(Detection Method of Teaching Jig 300)

The controller 20 operates the hand 13 in a state where the teaching jig 300 configured as described above is attached to a predetermined transfer position of the cassette 200, to detect the first detected portion 310 by the first sensor S1 and the second sensor S2 and detect the second detected portion 320 by the second sensor S2, and calculates and stores the transfer position from the position information of the hand 13 when the first detected portion 310 and the second detected portion 320 are detected.

The detection method of the teaching jig 300 will be described with reference to FIGS. 10 to 15. FIGS. 10 to 15 are explanatory diagrams (parts 1 to 6) of the detection method of the teaching jig 300.

Figure 10:
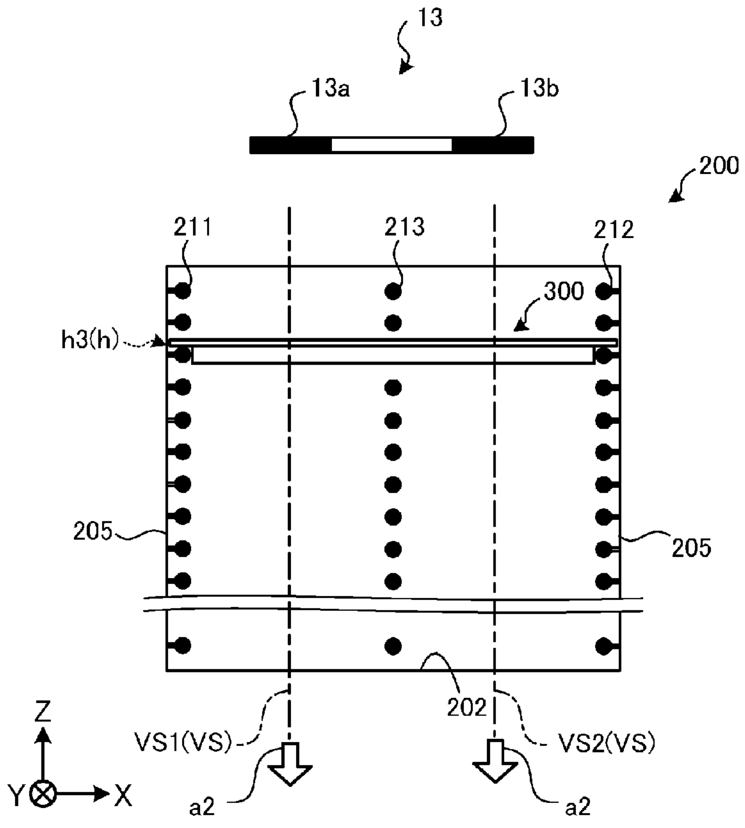
FIG. 10 is an explanatory diagram (part 1) of a method of detecting the teaching jig.

First, as illustrated in FIG. 10, the controller 20 brings the hand 13 close to the cassette 200 to a detectable distance of the first sensor S1, and positions the hand 13 above the cassette 200.

Then, the controller 20 then moves down the hand 13. At this time, the controller 20 moves the hand 13 along the Z-axis direction (see arrow a2 in FIG. 10) and causes the sensor S1 to perform a horizontal scanning along a trajectory VS. Further, the controller 20 moves the hand 13 until the scanning range of the sensor S1 reaches at least a bottom side 202 of the cassette 200.

Through this operation, the first sensor S1 may detect the presence or absence of the teaching jig 300 attached to the cassette 200. That is, the first sensor S1 may detect the presence or absence of the substrate 500 accommodated in the cassette 200 through this operation.

Then, based on the scan result of the first sensor S1, the controller 20 calculates the placement height h (here, the placement height h3), which is the height position of a transfer position to be taught where the teaching jig 300 is attached.

Figure 11:
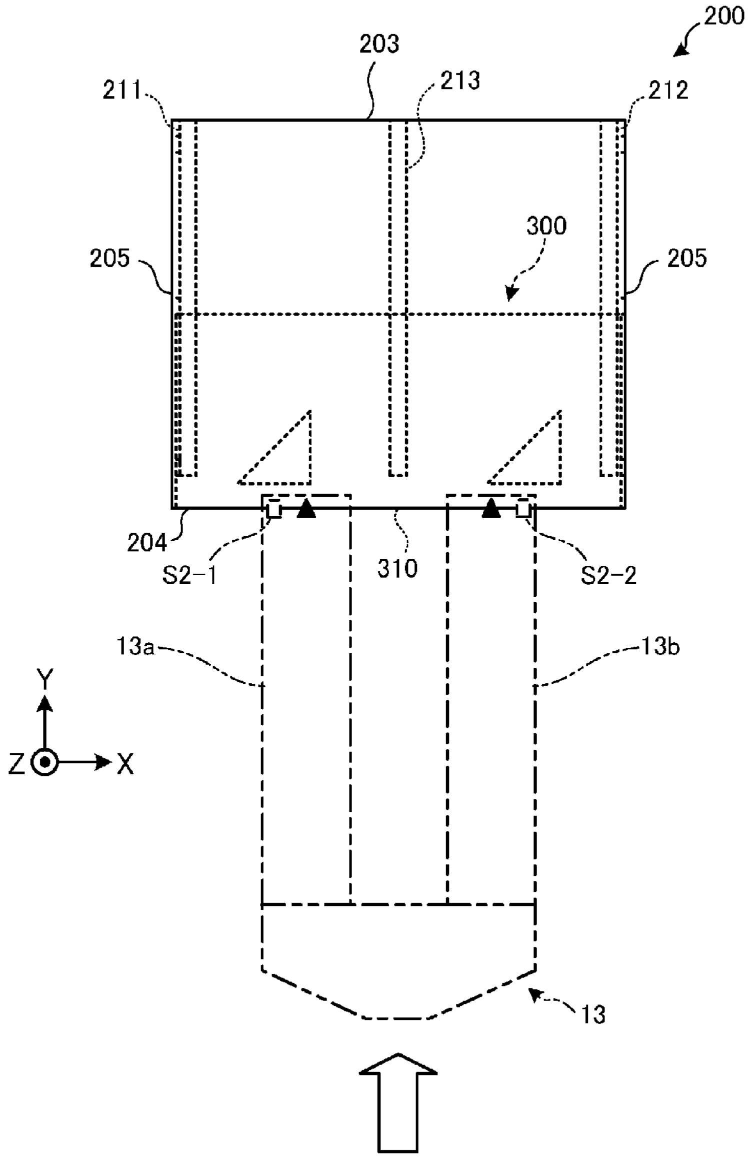
FIG. 11 is an explanatory diagram (part 2) of the method of detecting the teaching jig.

Subsequently, as illustrated in FIG. 11, the controller 20 detects the first detected portion 310 by the second sensor S2 while approaching the hand 13 from the front side 204 of the cassette 200 according to the height position of the transfer position. At this time, the controller 20 moves the hand 13 close to the transfer position such that the hand 13 is advanced to the lower side of the teaching jig 300. Then, the controller 20 calculates the angle and the position in the depth direction (Y-axis direction) of the hand 13 with respect to the transfer position based on the detection result of the first detected portion 310.

Figure 12:
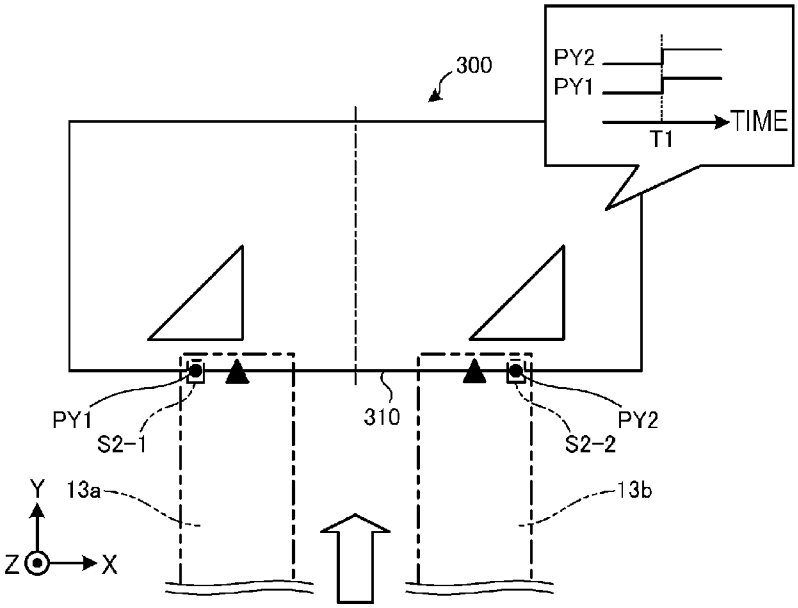
FIG. 12 is an explanatory diagram (part 3) of the method of detecting the teaching jig.

Specifically, as illustrated in FIG. 12, the controller 20 compares a detection timing between a detection point PY1 on the edge of the first detected portion 310 detected by a second sensor S2-1 and a detection point PY2 on the edge of the first detected portion 310 detected by a second sensor S2-2.

Then, as illustrated in FIG. 12, when the detection timings are simultaneous at time T1, the controller 20 determines that the angle of the hand 13 with respect to the cassette 200 is 0, that is, the advancing direction of the hand 13 is parallel to the depth direction (Y-axis direction) of the cassette 200.

Figure 13:
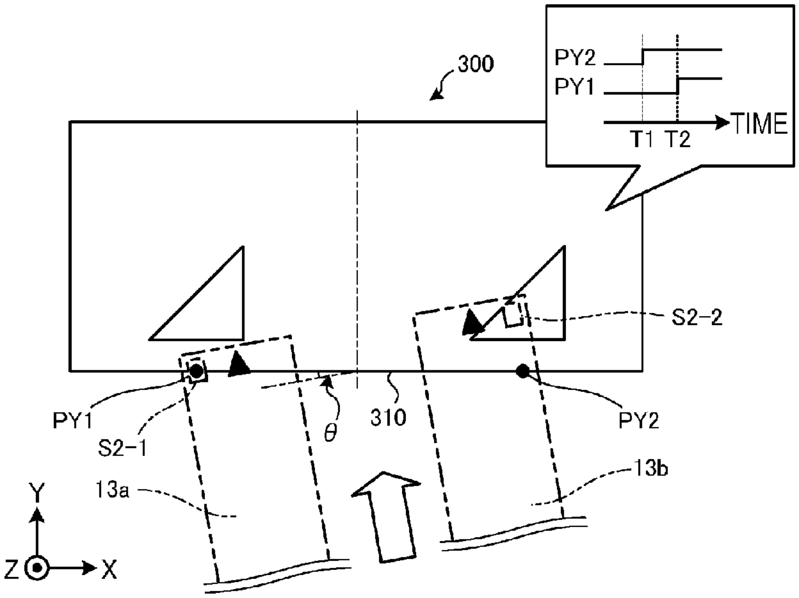
FIG. 13 is an explanatory diagram (part 4) of the method of detecting the teaching jig.

Meanwhile, when there is a deviation between the detection timings T1 and T2 as illustrated in FIG. 13, the controller 20 calculates the angle θ of the hand 13 with respect to the cassette 200 based on the deviation. That is, in this case, the controller 20 determines that the advancing direction of the hand 13 is not parallel to the depth direction (Y-axis direction) of the cassette 200. When the first detection line 321 is manufactured parallel to the first detected portion 310, the first detection line 321 may be used as the first detected portion. Even in this case, the above determination may be made at the timing when the first detection line 321 is detected by the second sensors S2-1 and S2-2, respectively, as described above.

Subsequently, the controller 20 further advances the hand 13 into the cassette 200. Then, the controller 20 continuously detects the first detection line 321 and the second detection line 322 of the second detected portion 320 by the second sensor S2.

At this time, when it is determined that the advancing direction of the hand 13 is not parallel to the depth direction (Y-axis direction) of the cassette 200 as illustrated in FIG. 13, the controller 20 once returns the hand 13 and re-advances the hand 13 into the cassette 200 so as to be parallel to each other.

Alternatively, the controller 20 may further advance the hand 13 into the cassette 200 in a non-parallel state without returning the hand 13 once.

Figure 14:
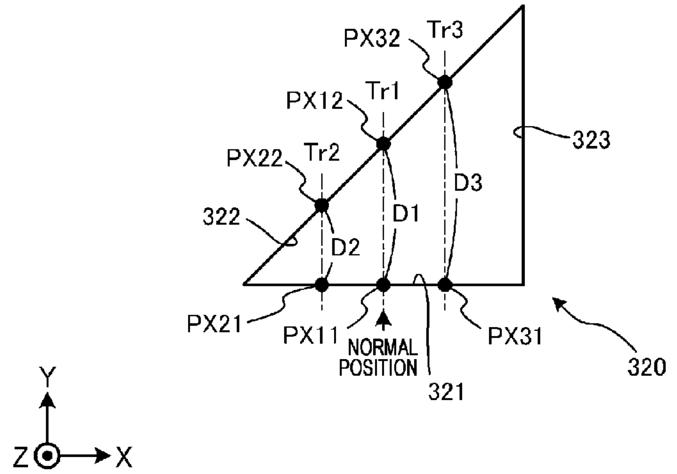
FIG. 14 is an explanatory diagram (part 5) of the method of detecting the teaching jig.

When the hand 13 is advanced into the cassette 200 in a state parallel to the depth direction (Y-axis direction) of the cassette 200, as illustrated in FIG. 14, the controller 20 detects the first detection line 321 and the second detection line 322, for example, on trajectories Tr1, Tr2, and Tr3, respectively, using the scanning line O2 of the second sensor S2.

A detection point PX11 is a detection point of the first detection line 321 on the trajectory Tr1. A detection point PX12 is a detection point of the second detection line 322 on the trajectory Tr1. A detection point PX21 is a detection point of the first detection line 321 on the trajectory Tr2. A detection point PX22 is a detection point of the second detection line 322 on the trajectory Tr2. A detection point PX31 is a detection point of the first detection line 321 on the trajectory Tr3. A detection point PX32 is a detection point of the second detection line 322 on the trajectory Tr3.

Here, it is assumed that the trajectory Tr1 indicates a normal position of the hand 13 in the left-right direction (X-axis direction). The controller 20 stores in advance the shape and size of the second detected portion 320 as well as a distance D1 between the detection points PX11 and PX12 on the trajectory Tr1, which are the normal positions, in the information regarding the teaching jig 300 described above.

Therefore, the controller 20 may calculate the distance between the actually detected detection points, and compare the calculated distance with the distance D1, thereby grasping the deviation of the hand 13 in the left-right direction (X-axis direction) from the transfer position.

For example, when detection points PX21 and PX22 are detected on the trajectory Tr2 and a distance D2 between the detection points PX21 and PX22 is calculated, the controller 20 calculates the deviation of the hand 13 in the left direction (the negative direction of the X-axis direction) with respect to the transfer position based on the difference between the distance D2 and the distance D1. Similarly, when detection points PX31 and PX32 are detected on the trajectory Tr3 and a distance D3 between the detection points PX31 and PX32 is calculated, the controller 20 calculates the deviation of the hand 13 in the right direction (the positive direction of the X-axis direction) with respect to the transfer position based on the difference between the distance D3 and the distance D1.

Figure 15:
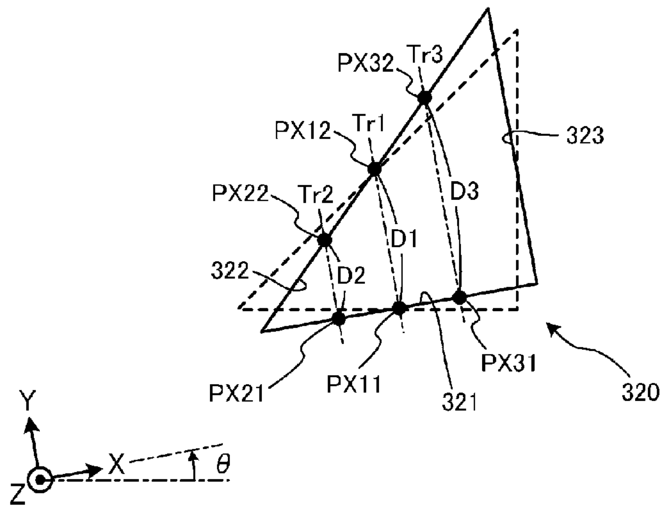
FIG. 15 is an explanatory diagram (part 6) of the method of detecting the teaching jig.

Furthermore, when the hand 13 is advanced into the cassette 200 in a state that is not parallel to the depth direction (Y-axis direction) of the cassette 200, as illustrated in FIG. 15, the controller 20 virtually rotates the second detected portion 320, for example, by an angle θ and detects each detection point on the rotated second detected portion 320. Then, the controller 20 calculates the deviation of the hand 13 in the left-right direction (X-axis direction) with respect to the transfer position based on the distance between the detection points.

From the above, the controller 20 may calculate the height position, the position in the depth direction, and the position in the left-right direction of the hand 13 with respect to the predetermined transfer position of the cassette 200 to which the teaching jig 300 is attached. Then, the controller 20 stores the calculated positions, and when the robot 10 actually transfers the substrate 500, appropriately corrects, for example, the movement of the robot 10 based on the stored information.

(Modification of Contact Portion 302)

Next, some modifications of the contact portion 302 will be described with reference to FIGS. 16 to 19. FIGS. 16 to 19 are diagrams (parts 1 to 4) illustrating modifications of the contact portion 302.

Figure 16:
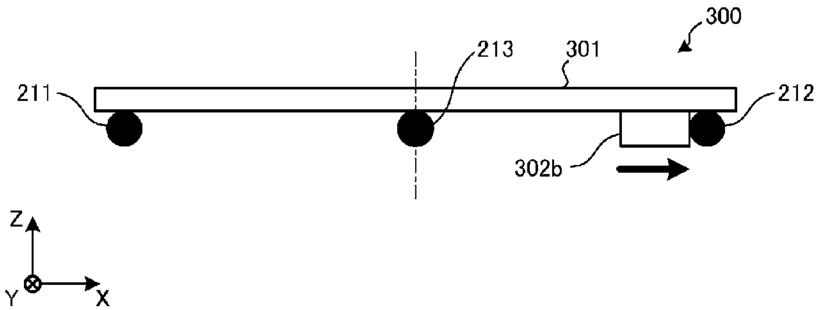
FIG. 16 is a diagram (part 1) illustrating a modification of the teaching jig.

As illustrated in FIG. 16, the contact portion 302 may be provided with a first protrusion **302*b* that is capable of being pressed against at least one of the first support portion 211, second support portion 212, and third support portion 213 in the left-right direction (X-axis direction) with respect to the front side 204 of the cassette 200**.

Figure 17:
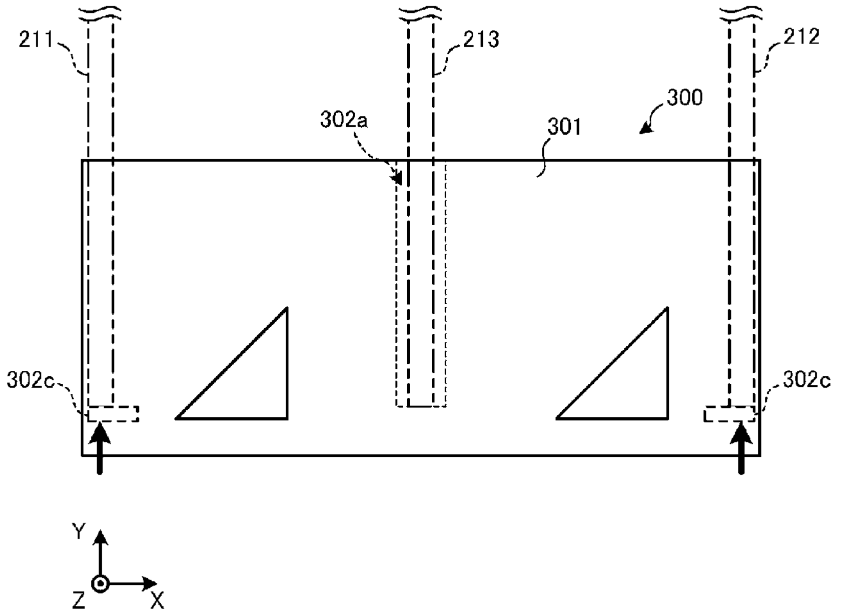
FIG. 17 is a diagram (part 2) illustrating a modification of the teaching jig.

Further, as illustrated in FIG. 17, the contact portion 302 may be provided with a second protrusion **302*c* that is capable of being pressed against the distal ends of the first support portion 211 and the second support portion 212 in the depth direction (Y-axis direction) with respect to the front side 204 of the cassette 200**.

Figure 18:
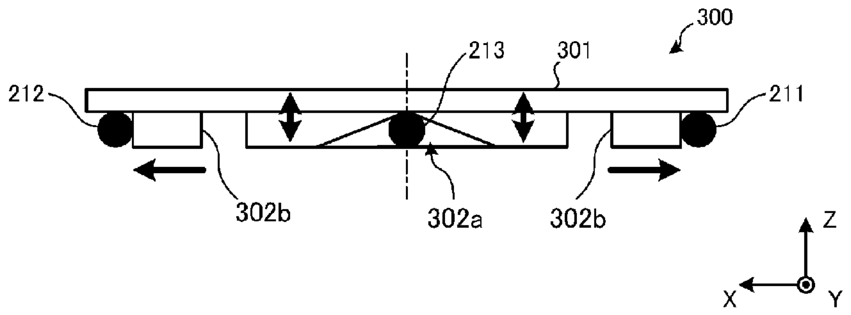
FIG. 18 is a diagram (part 3) illustrating a modification of the teaching jig.

Further, as illustrated in FIG. 18, the recess **302*a* and first protrusion 302*b* may be combined as appropriate. At this time, as illustrated in FIG. 18, two or more first protrusions 302*b* may be provided to be pressed against the first support portion 211 and the second support portion 212**, respectively.

Figure 19:
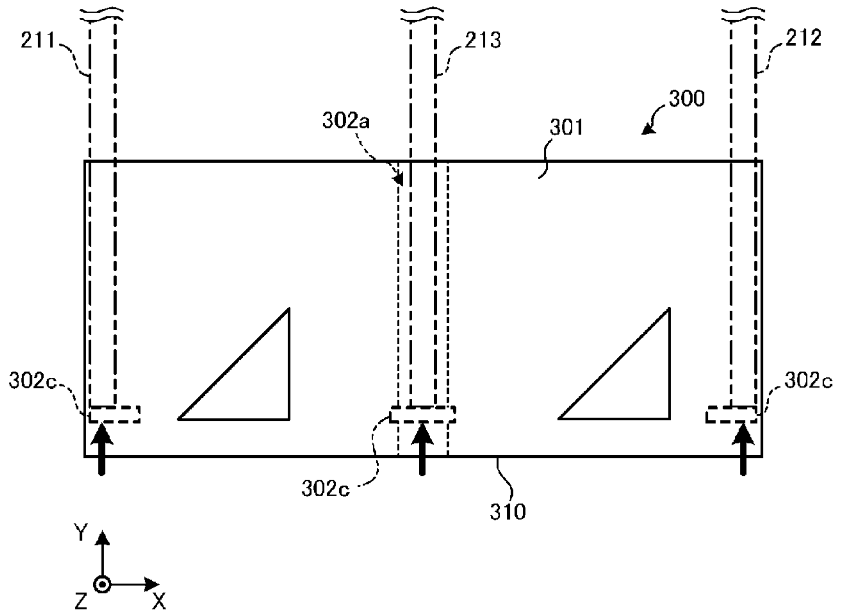
FIG. 19 is a diagram (part 4) illustrating a modification of the teaching jig.

Further, as illustrated in FIG. 19, the second protrusion **302*c* may also be provided to be further pressed against the distal end of the third support portion 213** in the depth direction (Y-axis direction).

(Configuration Example of Controller 20)

Figure 20:
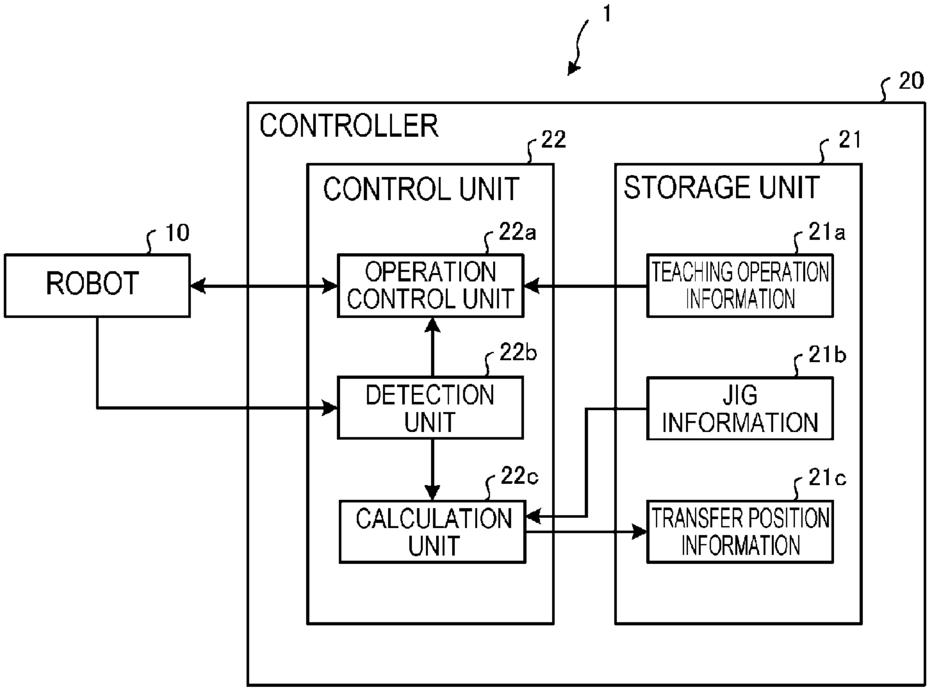
FIG. 20 is a block diagram of a robot system.

Next, a configuration of the robot system 1 illustrated in FIG. 1 will be described with reference to FIG. 20. FIG. 20 is a block diagram of the robot system 1. As described above, the robot system 1 includes the robot 10 and the controller 20 that controls the operation of the robot 10. Since the configuration example of the robot 10 has already been described with reference to FIG. 1, the configuration of the controller 20 will be mainly described here.

As illustrated in FIG. 20, the controller 20 includes a storage unit 21 and a control unit 22. The storage unit 21 corresponds to, for example, a random access memory (RAM) or a hard disk drive (HDD). The storage unit 21 stores teaching operation information **21*a*, jig information 21*b*, and transfer position information 21*c***.

The teaching operation information **21*a* is information that includes "jobs" that define the movement of the robot 10 including the movement trajectory of the hand 13 when teaching the transfer position of the substrate 500 to the robot 10. The teaching operation information 21*a* may include information about the external shape of the cassette 200**.

The jig information **21*b* is information regarding the teaching jig 300 described above. The jig information 21*b* includes various other information regarding the teaching jig 300, such as the shape and size of the teaching jig 300, the shape and size of the second detected portion 320, the position of the second detected portion 320, the positional relationship between the first detection line 321 and the second detection line 322, the positional relationship with the first detected portion 310**, and the distance D1 between the detection points PX11 and PX12 on the trajectory Tr1 which are the above-mentioned normal positions.

The transfer position information **21*c* is information including the height position, the position in the depth direction, and the position in the left-right direction of the hand 13 with respect to the predetermined transfer position of the cassette 200, which are calculated based on the detection results of the first detected portion 310 and second detected portion 320**.

The control unit 22 includes an operation control unit **22*a*, a detection unit 22*b*, and a calculation unit 22*c*. Further, the controller 20 is connected to the robot 10**.

Here, the controller 20 includes, for example, a computer having a central processing unit (CPU), a read only memory (ROM), a random access memory (RAM), a hard disk drive (HDD), an input/output port, or various circuits.

The CPU of the computer functions as the operation control unit **22*a*, the detection unit 22*b*, and the calculation unit 22*c* of the control unit 22 by reading and executing, for example, programs stored in the ROM. Further, at least one or all of the operation control unit 22*a*, the detection unit 22*b*, and the calculation unit 22*c* of the control unit 22** may be configured by hardware such as an application specific integrated circuit (ASIC) or a field programmable gate array (FPGA).

Further, the controller 20 may acquire the programs described above or various kinds of information via another computer or a portable recording medium connected by a wired or wireless network.

The operation control unit **22*a* performs operation control of the robot 10 based on the teaching operation information 21*a* or the detection results by the detection unit 22*b*. Specifically, the operation control unit 22*a* instructs actuators corresponding to the axes of the robot 10 based on the teaching operation information 21*a* stored in the storage unit 21, thereby causing the robot 10 to perform the teaching operation related to the transfer of the substrate 500. Further, the motion control unit 22*a* performs feedback control using encoder values of the actuators, thereby improving the motion accuracy of the robot 10**.

The detection unit **22*b* detects the presence or absence of the teaching jig 300, the placement height h of the teaching jig 300, the first detected portion 310, and the first detection line 321 and the second detection line 322 of the second detected portion 320** based on the scanning results of the first sensor S1 and the second sensor S2.

The calculation unit **22*c* calculates the height position of the transfer position to be taught, the angle and the position in the depth direction of the hand 13 with respect to the transfer position, and the position in the left-right direction of the hand 13 with respect to the transfer position, based on the detection results of the detection unit 22***b* and the jig information 21*b*, and records the calculation results in the transfer position information 21*c*.

(Processing Procedure)

Figure 21:
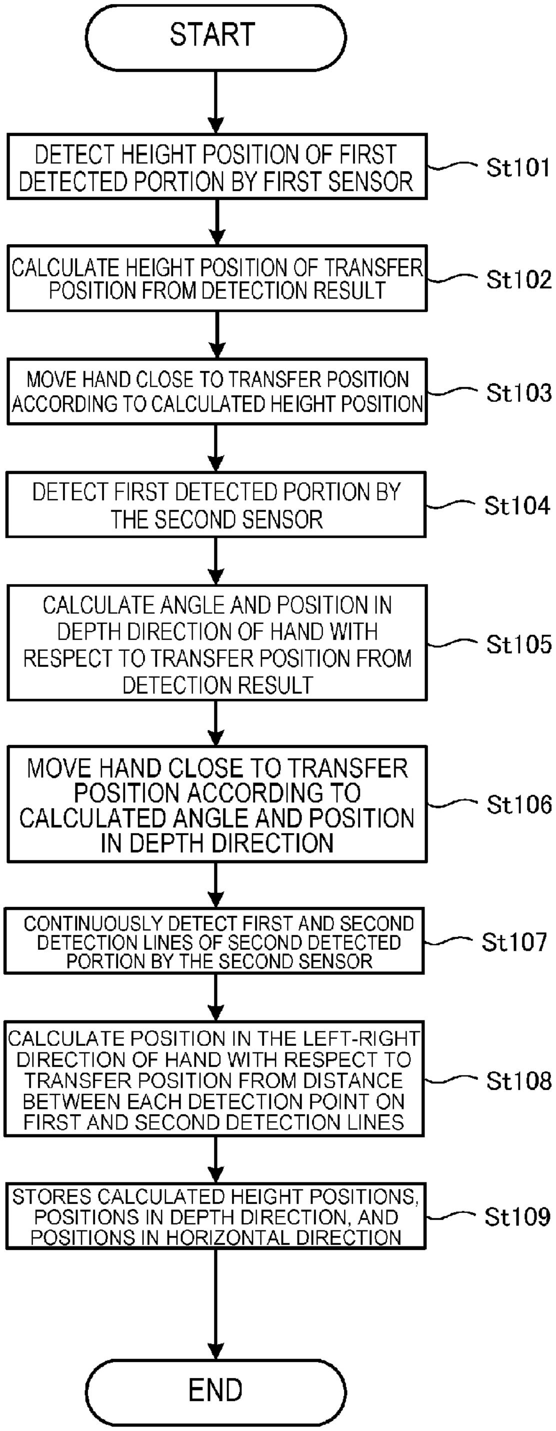
FIG. 21 is a flowchart illustrating a processing procedure executed by the robot system.

Next, the processing procedure executed by the robot system 1 will be described with reference to FIG. 21. FIG. 21 is a flowchart illustrating the processing procedure executed by the robot system 1.

FIG. 21 mainly illustrates the processing procedure executed by the controller 20, and it is assumed that the teaching jig 300 has already been positioned and attached by the contact portion 302 to the transfer position to be taught in the cassette 200 in the previous step before this processing procedure is executed. The processing procedure illustrated in FIG. 21 indicates a one-time processing procedure for one transfer position.

As illustrated in FIG. 21, the controller 20 first moves the hand 13 from above to below the cassette 200, and detects the height position of the first detected portion 310 using the first sensor S1 (step St101). Then, the controller 20 calculates the height position of the transfer position from the detection result (step St102).

Subsequently, the controller 20 moves the hand 13 close to the transfer position according to the calculated height position (step St103). At this time, the controller 20 moves the hand 13 close to the transfer position such that the hand 13 is advanced to the lower side of the teaching jig 300.

Then, the controller 20 detects the first detected portion 310 using the second sensor S2 (step St104). Then, the controller 20 calculates the angle and the position in the depth direction of the hand 13 with respect to the transfer position from the detection result (step St105).

Subsequently, the controller 20 moves the hand 13 close to the transfer position according to the calculated angle and the position in the depth direction (step St106). Then, the controller 20 continuously detects the first detection line 321 and the second detection line 322 of the second detected portion 320 by the second sensor S2 (step St107).

Then, the controller 20 calculates the position of the hand 13 in the left-right direction with respect to the transfer position from the distance between each detection point on the first detection line 321 and the second detection line 322 (step St108).

Then, the controller 20 stores the height positions, the positions in the depth direction, and the positions in the horizontal direction calculated in steps St102, St105, and St108 (step St109), and ends the process.

(About Rough Teaching)

The robot system 1 usually stores, in the teaching operation information 21*a*, information on the external shape of the cassette 200 such as various dimensions, and information on the teaching target including the positional relationship between the external shape and the transfer position (that is, each slot) in advance. When there is no information regarding this teaching target, the controller 20 may perform a teaching method that may be called "rough teaching" in which the controller 20 roughly grasps the positional relationship of the transfer position with respect to the cassette 200, based on the external feature of the cassette 200 detected by the first sensor S1.

FIGS. 22 to 25 are explanatory diagram (parts 1 to 4) of the rough teaching. In the rough teaching, the controller 20 operates the hand 13 in each axis direction of XYZ to roughly grasp the external feature of the cassette 200 by the first sensor S1.

Figure 22:
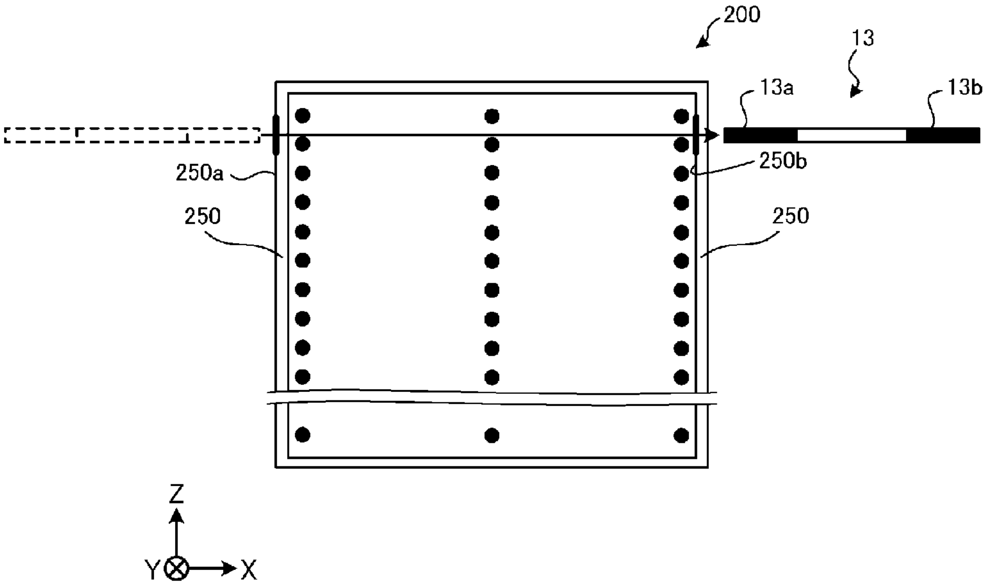
FIG. 22 is an explanatory diagram (part 1) of rough teaching.

Regarding the X-axis direction, as illustrated in FIG. 22, the controller 20 moves the hand 13 along the left-right direction (X-axis direction) of the cassette 200, thereby causing the first sensor S1 to detect an outer surface 250*a* of one of the opposing side walls 250 of the cassette 200 and the inner surface 250*b* of the other side wall 250. Thus, the controller 20 grasps the rough external feature of the cassette 200 in the X-axis direction.

Figure 23:
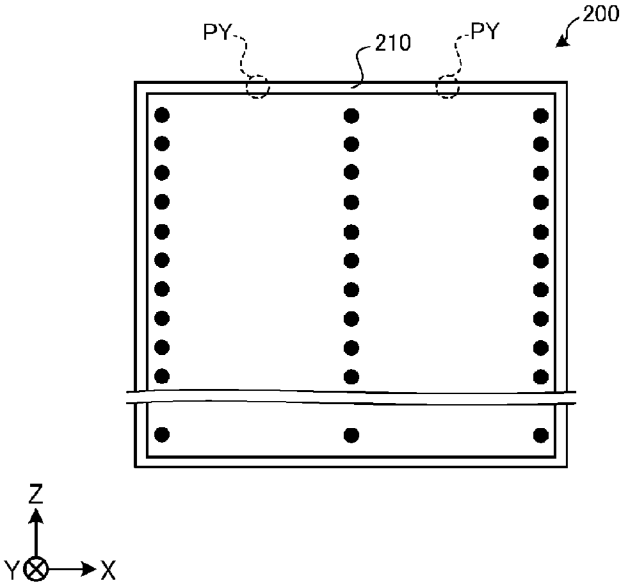
FIG. 23 is an explanatory diagram (part 2) of rough teaching.
Figure 24:
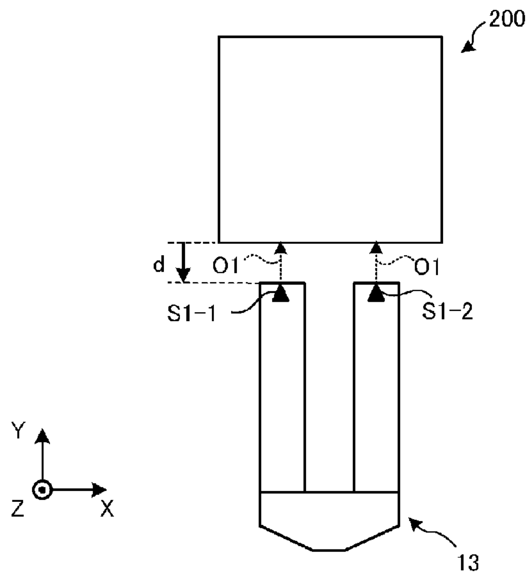
FIG. 24 is an explanatory diagram (part 3) of rough teaching.

Further, in the Y-axis direction, as illustrated in FIG. 23, the controller 20 causes the first sensor S1 to detect the end surface of a top plate 210 observed when the cassette 200 is viewed from the front side 204. It is necessary to perform detection in the Y-axis direction prior to detection in the X-axis direction illustrated in FIG. 22. The detection in the X-axis direction is performed based on the results of the detection in the Y-axis direction. This is an important premise in order to prevent the hand 13 from coming into contact with the cassette 200. Regarding the Y-axis direction, as illustrated in FIG. 24, the controller 20 moves the hand 13 along the depth direction (Y-axis direction) up to the detectable distance d of the scanning line O1 of the first sensor S1 to bring the hand 13 close to the cassette 200, thereby causing the first sensor S1 to detect the end surface of the top plate 210. The detection points are, for example, two detection points PY illustrated in FIG. 23. Thus, the controller 20 grasps the rough external feature of the cassette 200 in the Y-axis direction.

Figure 25:
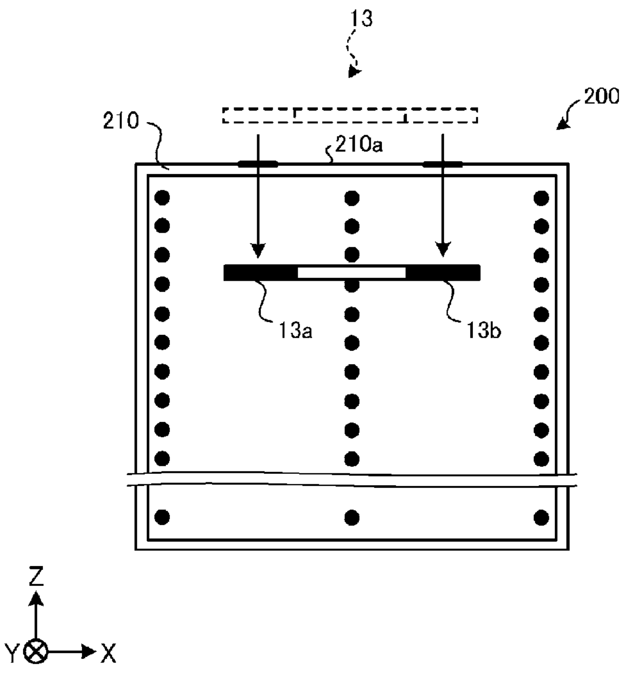
FIG. 25 is an explanatory diagram (part 4) of rough teaching.

Regarding the Z-axis direction, as illustrated in FIG. 25, the controller 20 moves the hand 13 along the vertical direction (Z-axis direction) of the cassette 200, in the same manner as already illustrated in FIG. 10, thereby causing the first sensor S1 to detect the outer surface 210*a* of the top plate 210 of the cassette 200. Thus, the controller 20 grasps the rough external feature of the cassette 200 in the Z-axis direction.

Then, the controller 20 roughly estimates the positional relationship of each slot (that is, each transfer position) with respect to the cassette 200 based on the grasped external features of the cassette 200 in the X, Y, and Z axis directions. Then, the controller 20 teaches the robot 10 to be taught each transfer position based on the estimated positional relationship.

By enabling such rough teaching, auto-teaching based on the rough external features of the cassette 200 becomes possible.

SUMMARY

As described above, the robot system 1 according to one of the embodiments is a substrate transfer robot system that teaches a robot 10 (corresponding to an example of a "substrate transfer robot") that transfers 500 substrates the transfer position of a substrate 500. The robot 10 includes: a hand 13 that transfers the substrate 500; a movement mechanism that moves the hand 13 in a horizontal direction and in a vertical direction; a first sensor S1 that is provided on the hand 13 and radiates a scanning line O1 in the horizontal direction and a second sensor S2 that is provided on the hand 13 and radiates a scanning line O2 in the vertical direction; a controller 20 that controls the hand 13 and the movement mechanism: and a first detected portion 310 and a second detected portion 320 of which positions from the transfer position and positions from each other are known, the first and second portions 310 and 320 being provided at the transfer position. The controller 20 operates the hand 13 to detect the first detected portion 310 by the first sensor S1 and the second sensor S2 and detect the second detected portion 320 by the second sensor S2, and calculates and stores the transfer position from the position information of the hand 13 when the first detected portion 310 and the second detected portion 320 are detected.

Thus, by performing teaching based on the detection results of the first detected portion 310 and the second detected portion 320 by the first sensor S1 and the second sensor S2, the teaching work may be automated while human error is less likely to occur. Accordingly, it is possible to improve the efficiency and precision of the teaching work when loading and unloading the board 500.

Further, the second detected portion 320 has a first detection line 321 and a second detection line that are at least non-parallel to each other and have a known positional relationship, which may be continuously detected by the second sensor S2 while the hand 13 is being operated by the movement mechanism.

Thus, by performing teaching based on the detection results of the second detected portion 320, which is equipped with a first detection line 321 and a second detection line 322 that enable the calculation of the amount of the positional deviation in the horizontal direction, the teaching work may be automated while human error is less likely to occur. Accordingly, it is possible to improve the efficiency and precision of the teaching work when loading and unloading the board 500.

Further, when the hand 13 approaches the transfer position from below, the first detection line 321 and the second detection line 322 in the second detected portion 320 are detected by the second sensor S2 from below the transfer position.

Thus, the teaching work may be performed without installing a new dedicated teaching sensor, by using an existing sensor such as the second sensor S2 whose scanning direction is the vertical direction, that is, a load presence sensor that detects the presence or absence of the substrate 500 on the hand 13.

Further, the first detected portion 310 and the second detected portion 320 are provided in a teaching jig 300, and the teaching jig 300 may be installed at the transfer position.

Thus, it is possible to improve the efficiency of the teaching work by using the teaching jig 300 that may be installed at the transfer position.

Further, the teaching jig 300 may be attached to a cassette 200 capable of accommodating the substrate 500.

Thus, the teaching work may be easily performed by using the teaching jig 300 capable of being attached to the cassette 200.

Further, the cassette 200 includes a first support portion 211 and a second support portion that support both ends of the substrate 500, respectively, when viewed from a front side 204 of the cassette 200, and a third support portion 213 that supports the substrate 500 between the first support portion 211 and the second support portion 212 when viewed from the front side 204 of the cassette 200. The teaching jig 300 is attachable to at least one of the first support portion 211, the second support portion 212, and the third support portion 213.

Thus, the teaching work may be easily performed by using the teaching jig 300 capable of being attached to a general-purpose cassette 200.

Further, the first detected portion 310 is a front end portion of the teaching jig 300 that is exposed on the front side of the cassette 200 when the teaching jig 300 is attached to the cassette 200.

Thus, the teaching work for loading and unloading the substrate 500 may be performed based on the detection results with the front end of the teaching jig 300 as the first detected portion 310.

Further, the first sensor S1 may further detect the presence or absence of the substrate 500 accommodated in the cassette 200 when the hand 13 is moved in the vertical direction by the movement mechanism. The second sensor S2 may further detect the presence or absence of the substrate 500 when the substrate 500 is supported by the hand 13.

Thus, it is possible to perform mapping based on the presence or absence of the substrate 500.

Further, the second sensor S2 is provided at at least two positions at a predetermined distance apart in the hand 13.

Thus, since the second sensor S2 is provided at two or more locations, it is possible to detect the detection timing deviation of the sensor when the first detected portion 310 is detected, and then, the hand 13 may approach the second detected portion 320 at a predetermined angle.

Further, the first sensor S1 and the second sensor S2 are provided on the distal end side of the hand 13. The first detected portion 310 and the second detected portion 320 are provided at positions close to the front side 204 of the cassette 200 when the teaching jig 300 is attached to the cassette 200. The first sensor S1 and the second sensor S2 detect the first detected portion 310 and the second detected portion 320 before the hand 13 reaches the deep portion of the cassette 200.

Thus, the teaching work may be performed safely without advancing the hand 13 into the deep portion of the cassette 200.

Further, the hand 13 includes at least the first fork portion **13*a* that may be advanced between the first support portion 211 and the third support portion 213, and the second fork portion 13*b* that may be advanced between the second support portion 212 and the third support portion 213. The first fork portion 13*a* and the second fork portion 13*b* include the first sensor S1 and the second sensor S2, respectively. The second detected portion 320 is provided at least one between the first support portion 211 and the third support portion 213 and between the second support portion 212 and the third support portion 213, and close to the front 204 side of the cassette 200 when the teaching jig 300 is attached to the cassette 200. Further, the first fork portion 13*a* is advanced between the first support portion 211 and the third support portion 213, and the second fork portion 13*b* is advanced between the second support portion 212 and the third support portion 213**.

Thus, it is possible to calculate the amount of the positional deviation in the horizontal direction based on the detection result of the second detected part 320 at an early stage near the front surface 204 of the cassette 200, that is, near the opening.

Further, the teaching jig 300 is positioned in the horizontal direction and the vertical direction by the contact portion 302 that contacts at least two of the first support portion 211, the second support portion 212, and the third support portion 213, and is detachably provided with respect to the first support portion 211, the second support portion 212, and the third support portion 213.

Thus, it is possible to improve the precision of the teaching work using the teaching jig 300, which is likened to the substrate 500 at an ideal position with respect to a predetermined transfer position of the cassette 200.

Further, the contact portion 302 is provided to be at least partially movable with respect to the base portion 301 of the teaching jig 300 so that the position of the teaching jig 300 may be adjusted with respect to the cassette 200.

This enables position adjustment, so that the teaching jig 300 may be accurately placed in a correct position regardless of the internal shape of the cassette 200 (arrangement and shape of each support portion, etc.).

Further, the contact portion 302 has a recess 302*a* that determines the position of the teaching jig 300 in the left-right direction with respect to the front side 204 of the cassette 200 by fitting the third support portion 213 thereto. The recess 302*a* is further provided such that the depth of the depression of the recess 302*a* may be changed.

Thus, by fixing the third support portion 213 at a central position, the teaching jig 300 may be positioned with high accuracy in the horizontal direction. Further, the central position is highly versatile regardless of the cassette 200. Further, there is a high probability that the third support portion 213 has a bar shape, and the groove shape may also be highly versatile. Moreover, the structure is simple. Further, by making the depth of the depression variable, the teaching jig 300 may be easily fixed according to the shape of the third support portion 213.

Further, the recess 302*a* is formed to be able to be pressed against the distal end of the third support portion 213 in the depth direction when viewed from the front surface 204 of the cassette 200, thereby at least determining the position of the teaching jig 300 in the depth direction.

Thus, the teaching jig 300 may be positioned with high precision in the depth direction with a simple structure.

Further, the contact portion 302 is provided with a first protrusion 302*b* that is capable of being pressed against at least one of the first support portion 211, second support portion 212, and third support portion 213 in the left-right direction with respect to the front side 204 of the cassette 200.

Thus, the teaching jig 300 may be positioned with high precision in the left-right direction while being less susceptible to the influence of deflection of each support portion. Further, since the position may be adjusted, it is possible to follow various internal shapes of the cassette 200 (such as the arrangement and shape of each support portion), and the teaching jig 300 may be positioned with high accuracy in the left-right directions.

Further, the contact portion 302 may be provided with a second protrusion 302*c* that is capable of being pressed against the distal ends of the first support portion 211 and the second support portion 212 in the depth direction with respect to the front side 204 of the cassette 200.

Thus, the teaching jig 300 may be positioned with high precision in the depth direction while being less susceptible to the influence of deflection of each support portion. Further, since the position may be adjusted, it is possible to follow various internal shapes of the cassette 200 (such as the arrangement and shape of each support portion), and the teaching jig 300 may be positioned with high accuracy in the depth directions.

Further, the second protrusion 302*c* is further provided to be able to press against the distal end of the third support portion 213 in the depth direction.

Therefore, by pressing not only the first support portion 211 and the second support portion 212 but also the third support portion 213 in the depth direction, the teaching jig 300 may be positioned with high accuracy in the depth direction while being less affected by deflection of each support portion.

Further, the controller 20 operates the hand 13 and calculates the height position of the transfer position from information obtained when the height position of the first detected portion 310 is detected by the first sensor S1. In addition, the controller 20 detects the first detected portion 310 with the second sensor S2 while moving the hand 13 closer to the transfer position according to the height position of the transfer position, and calculates the angle and the position in the depth direction of the hand 13 with respect to the transfer position. Further, the controller 20 continuously detects the first detection line 321 and the second detection line 322 of the second detected portion 320 by the second sensor S2 while moving the hand 13 close to the transfer position according to the angle and the position in the depth direction of the hand 13. Further, the controller 20 calculates the position of the hand 13 in the left-right direction with respect to the transfer position from the distance between each detection point on the first detection line 321 and the second detection line 322. Further, the controller 20 stores the height position, the position in the depth direction position, and the position in the left-right direction.

Thus, it is possible to efficiently and accurately teach the transfer position based on the detection results of the first sensor S1 and the second sensor S2.

In the above-described embodiment, the movement mechanism of the robot 10 has been exemplified with a horizontally articulated SCARA arm and a lift mechanism that moves up and down the arm, but the configuration of the movement mechanism is not limited to this example. For example, the movement mechanism may be implemented by combining a robot with fewer axes than the robot 10 illustrated in FIG. 1 with a lift mechanism that moves up and down the robot along the vertical direction (Z-axis direction) of the cassette 200 and a movement mechanism that moves the robot along the left-right direction (X-axis direction) or the depth direction (Y-axis direction).

Further, in the above-described embodiment, the substrate 500 has been exemplified with a panel such as a substrate of a glass substrate having a rectangular outer shape, but the substrate 500 may be a wafer having a circular outer shape or a thin plate of any shape and any material. In this case, the teaching jig 300 may be formed as appropriate to enable positioning in each of the XYZ directions of the transfer position according to the shape of the substrate 500.

According to one aspect of the embodiment, it is possible to provide a substrate transfer robot system and a teaching method for the substrate transfer robot, which may improve the efficiency and precision of the teaching work in loading and unloading substrates.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate transfer robot system that teaches a transfer position of a substrate to a substrate transfer robot that transfers the substrate, wherein the substrate transfer robot includes:

a hand configured to transfer the substrate;

a mover configured to move the hand in a horizontal direction and in a vertical direction; and first and second sensors provided on the hand and configured to radiate a scanning line in the horizontal direction and in the vertical direction, respectively, wherein the substrate transfer robot system comprises:

a controller configured to control the hand and the mover; and a first portion to be detected and a second portion to be detected of which positions from the transfer position and positions from each other are known, the first and second portions being provided at the transfer position, wherein the controller is configured to:

operate the hand to detect the first portion by the first and second sensors and detect the second portion by the second sensor, and calculate and store the transfer position based on position information of the hand when the first and second portions are detected, wherein the second portion includes first and second detection lines that are continuously detectable by the second sensor while the hand is being operated by the mover, the first and second detection lines being non-parallel to each other and having a known positional relationship, the first and second portions are provided on a teaching jig configured to be installed at the transfer position, the first sensor is further configured to detect presence or absence of the substrate accommodated in the cassette when the hand is moved in the vertical direction by the mover, the second sensor is further configured to detect presence or absence of the substrate when the substrate is supported by the hand, and the first and second sensors are shared for both the teaching of the transfer position and the detection of the substrate during the substrate transfer operation.

2. The substrate transfer robot system according to claim 1, wherein, in the second portion, the first and second detection lines are detected by the second sensor from below the transfer position when the hand approaches the transfer position from below.

3. The substrate transfer robot system according to claim 1, wherein the teaching jig is attachable to a cassette that accommodates the substrate.

4. The substrate transfer robot system according to claim 3, wherein the cassette includes:

a first support and a second support configured to support both ends of the substrate, respectively, when viewed from a front side of the cassette; and a third support configured to support the substrate between the first and second supports when viewed from the front side of the cassette, and wherein the teaching jig is attachable to at least one of the first to third supports.

5. The substrate transfer robot system according to claim 3, wherein the first portion is a front end portion of the teaching jig that is exposed on the front side of the cassette, when the teaching jig is attached to the cassette.

6. The substrate transfer robot system according to claim 1, wherein the second sensor is provided in at least two positions separated by a predetermined distance in the hand.

7. The substrate transfer robot system according to claim 4, wherein the first and second sensors are provided on a distal end side of the hand, the first and second portions are provided at a position close to the front side of the cassette when the teaching jig is attached to the cassette, and the first and second sensors detect the first and second portions before the hand reaches an inner portion of the cassette.

8. The substrate transfer robot system according to claim 4, wherein the hand includes at least a first fork that is capable of advancing between the first support and the third support, and a second fork that is capable of advancing between the second support and the third support, the first and second forks each include the first and second sensors, the second portion is located at least one between the first support and the third support and between the second support and the third support, and close to the front side of the cassette when the teaching jig is attached on the cassette; and the first fork advances between the first support and the third support, and the second fork advances between the second support and the third support.

9. The substrate transfer robot system according to claim 4, wherein the teaching jig is positioned in the horizontal direction and the vertical direction by a contact that contacts at least two of the first support, the second support, and the third support, and removably provided with respect to the first support, the second support, and the third support.

10. The substrate transfer robot system according to claim 9, wherein the contact is provided such that at least a portion thereof is movable with respect to a base of the teaching jig to adjust a position of the teaching jig with respect to the cassette.

11. The substrate transfer robot system according to claim 10, wherein the contact includes a recess into which the third support is fitted, thereby determining at least the position of the teaching jig in a left-right direction with respect to the front side of the cassette, and the recess is provided such that a depth of depression of the recess is changeable.

12. The substrate transfer robot system according to claim 11, wherein the recess is formed to be pressed against a distal end of the third support in a depth direction when viewed from the front side of the cassette, thereby determining at least the position of the teaching jig in the depth direction.

13. The substrate transfer robot system according to claim 10, wherein the contact includes a first convex portion that is provided to be pressed against at least one of the first support, the second support, and the third support in a left-right direction with respect to the front side of the cassette.

14. The substrate transfer robot system according to claim 10, wherein the contact portion includes a second convex portion that is provided to be pressed against distal ends of the first support and the second support in the depth direction with respect to the front side of the cassette.

15. The substrate transfer robot system according to claim 14, wherein the second convex portion is further provided to be pressed against the distal end of the third support portion in the depth direction.

16. The substrate transfer robot system according to claim 1, wherein the controller is configured to:

calculate a height position of the transfer position based on information obtained when the hand is operated to detect a height position of the first detected portion by the first sensor, detect the first portion by the second sensor while moving the hand closer to the transfer position according to the height position of the transfer position, thereby calculating an angle and a depth direction position of the hand with respect to the transfer position, detect the first detection line and the second detection line of the second portion by the second sensor while moving the hand closer to the transfer position according to the angle and the depth direction position of the hand, calculate a left-right direction position of the hand with respect to the transfer position based on a distance between respective detection points on the first detection line and the second detection line, and store the height position, the depth direction position, and the left-right direction position.

17. A teaching method for a substrate transfer robot performed by a substrate transfer robot system that teaches a transfer position of a substrate to the substrate transfer robot that transfers the substrate, wherein the substrate transfer robot includes:

a hand configured to transfer the substrate;

a mover configured to move the hand in a horizontal direction and in a vertical direction;

first and second sensors provided on the hand and configured to radiate a scanning line in the horizontal direction and in the vertical direction, respectively, wherein the first sensor is further configured to detect presence or absence of the substrate accommodated in the cassette when the hand is moved in the vertical direction by the mover, and the second sensor is further configured to detect presence or absence of the substrate when the substrate is supported by the hand, and the first and second sensors are shared for both the teaching of the transfer position and the detection of the substrate during the substrate transfer operation, and wherein the substrate transfer robot system comprises:

a controller configured to control the hand and the mover; and a first portion to be detected and a second portion to be detected of which positions from a transfer position and positions from each other are known, the first and second portions being provided at the transfer position, wherein the second portion includes first and second detection lines that are continuously detectable by the second sensor while the hand is being operated by the mover, the first and second detection lines being non-parallel to each other and having a known positional relationship, the first and second portions are provided on a teaching jig configured to be installed at the transfer position, the teaching method comprising:

operating the hand to detect the first portion by the first and second sensors and detect the second portion by the second sensor, calculating and storing the transfer position based on position information of the hand when the first and second portions are detected.

* * * * *